US011398715B2

(12) United States Patent
Nozaki et al.

(10) Patent No.: US 11,398,715 B2
(45) Date of Patent: Jul. 26, 2022

(54) SEMICONDUCTOR LIGHT EMITTING DEVICE

(71) Applicant: PANASONIC CORPORATION, Osaka (JP)

(72) Inventors: Shinichiro Nozaki, Osaka (JP); Shinichi Takigawa, Osaka (JP)

(73) Assignee: PANASONIC HOLDINGS CORPORATION, Osaka (JP)

(*) Notice: Subject to any disclaimer, the term of this patent is extended or adjusted under 35 U.S.C. 154(b) by 72 days.

(21) Appl. No.: 16/975,648

(22) PCT Filed: Dec. 19, 2018

(86) PCT No.: PCT/JP2018/046758
§ 371 (c)(1),
(2) Date: Aug. 25, 2020

(87) PCT Pub. No.: WO2019/163274
PCT Pub. Date: Aug. 29, 2019

(65) Prior Publication Data
US 2020/0412102 A1    Dec. 31, 2020

(30) Foreign Application Priority Data

Feb. 26, 2018 (JP) .............................. JP2018-031645
Feb. 26, 2018 (JP) .............................. JP2018-031653

(51) Int. Cl.
*H01S 5/40* (2006.01)
*H01S 5/343* (2006.01)
(Continued)

(52) U.S. Cl.
CPC .......... *H01S 5/4031* (2013.01); *H01S 5/0234* (2021.01); *H01S 5/1053* (2013.01); *H01S 5/2231* (2013.01); *H01S 5/34326* (2013.01)

(58) Field of Classification Search
CPC ........ H01S 5/4031–4093; H01S 5/1053–1067; H01S 5/0205–0218; H01S 5/3202–3203; H01L 27/15–156; H01L 25/075–0753
See application file for complete search history.

(56) References Cited

U.S. PATENT DOCUMENTS 4,805,179 A * 2/1989 Harder ................... H01S 5/2203
372/45.01
4,971,415 A * 11/1990 Hara ...................... H01L 27/153
257/E27.121
(Continued)

FOREIGN PATENT DOCUMENTS

CA      2284946 A1 *  4/2001   ............ H01S 5/405
CN    105144413 A  * 12/2015   ............... H01S 5/42
(Continued)

OTHER PUBLICATIONS

International Search Report issued in corresponding International Patent Application No. PCT/JP2018/046758, dated Mar. 26, 2019, with English translation.

*Primary Examiner* — Joshua King
(74) *Attorney, Agent, or Firm* — McDermott Will & Emery LLP

(57) ABSTRACT

A semiconductor light emitting device includes a substrate, and an array including three or more light emitting elements which are aligned above and along a main surface of a substrate and each emit light. The light emitting elements each include a clad layer of a first conductivity type, an active layer containing In, and a clad layer of a second conductivity type disposed above the substrate sequentially from the substrate. Among the light emitting elements, the compositional ratio of In in the active layer is smaller in the light emitting element located in a central area in an align- (Continued)

ment direction than that in the light emitting elements located in both end areas in the alignment direction.

2 Claims, 14 Drawing Sheets

(51) Int. Cl.
*H01S 5/10* (2021.01)
*H01S 5/223* (2006.01)
*H01S 5/0234* (2021.01)

(56) References Cited

U.S. PATENT DOCUMENTS

| | | | | |
|---|---|---|---|---|
| 5,039,627 | A * | 8/1991 | Menigaux | H01S 5/4043 438/35 |
| 5,115,285 | A * | 5/1992 | Menigaux | H01L 33/0062 257/96 |
| 5,436,192 | A * | 7/1995 | Epler | H01L 29/66318 257/E21.09 |
| 5,812,576 | A * | 9/1998 | Bour | H01S 5/4031 372/45.01 |
| 5,872,022 | A * | 2/1999 | Motoda | H01S 5/2232 438/39 |
| 5,888,842 | A * | 3/1999 | Chu | H01S 5/18355 438/40 |
| 5,981,307 | A * | 11/1999 | Matsuda | G03F 7/70408 372/102 |
| 6,731,850 | B1 * | 5/2004 | Sargent | H01S 5/50 385/131 |
| 6,744,800 | B1 * | 6/2004 | Kneissl | H01L 21/2007 372/50.1 |
| 6,995,399 | B2 * | 2/2006 | Abe | B82Y 20/00 257/79 |
| 2004/0146080 | A1 * | 7/2004 | Yamada | H01S 5/405 372/46.01 |
| 2005/0040386 | A1 * | 2/2005 | Choa | H01S 5/34 257/14 |
| 2005/0141577 | A1 * | 6/2005 | Ueta | H01S 5/34333 372/43.01 |
| 2006/0094244 | A1 * | 5/2006 | Yamada | H01L 21/0237 438/700 |
| 2008/0205459 | A1 * | 8/2008 | Yonekubo | H04N 9/3129 372/26 |
| 2010/0103968 | A1 * | 4/2010 | Baba | H01S 5/32341 372/44.011 |
| 2012/0250715 | A1 * | 10/2012 | Muller | H01S 5/405 372/45.01 |
| 2012/0320561 | A1 * | 12/2012 | Nozaki | G02B 27/0994 362/19 |
| 2015/0323143 | A1 * | 11/2015 | Raring | H01S 5/4093 362/510 |
| 2017/0330757 | A1 * | 11/2017 | Eichler | H01L 21/02293 |
| 2017/0330996 | A1 * | 11/2017 | Lell | H01S 5/1082 |
| 2017/0331257 | A1 * | 11/2017 | Eichler | H01S 5/1053 |
| 2617/0330757 | | 11/2017 | Eichler et al. | |

FOREIGN PATENT DOCUMENTS

| | | | | |
|---|---|---|---|---|
| DE | 4432410 A1 | * | 3/1996 | H01S 5/125 |
| DE | 102017109812 A1 | * | 11/2017 | H01S 5/3013 |
| DE | 102010045782 B4 | * | 9/2018 | H01S 5/34333 |
| GB | 2476250 A | * | 6/2011 | H01S 5/3086 |
| JP | 61231789 A | * | 10/1986 | H01S 5/4031 |
| JP | 4-192483 A | | 7/1992 | |
| JP | H0821749 B2 | * | 3/1996 | H01S 5/4031 |
| JP | H07154036 A | * | 6/1996 | |
| JP | H08237203 A | * | 9/1996 | |
| JP | 3081094 B2 | * | 8/2000 | H01S 5/4031 |
| JP | WO2003071642 A1 | * | 6/2005 | G11B 7/127 |
| JP | 3950630 B2 | * | 8/2007 | H01L 21/02378 |
| JP | 2010108993 A | * | 5/2010 | H01S 5/32341 |
| JP | 2011507263 A | * | 3/2011 | |
| JP | 2017-208543 A | | 11/2017 | |
| WO | WO-2007097411 A1 | * | 8/2007 | B82Y 20/00 |
| WO | WO-2011145370 A1 | * | 11/2011 | H01L 33/0095 |
| WO | WO-2019067455 A1 | * | 4/2019 | H01S 5/4087 |

* cited by examiner

SEMICONDUCTOR LIGHT EMITTING DEVICE

CROSS-REFERENCE OF RELATED APPLICATIONS

This application is the U.S. National Phase under 35 U.S.C. § 371 of International Patent Application No. PCT/JP2018/046758, filed on Dec. 19, 2018, which in turn claims the benefit of Japanese Application No. 2018-031645, filed on Feb. 26, 2018, and Japanese Application No. 2018-031653, filed Feb. 26, 2018, the entire disclosures of which Applications are incorporated by reference herein.

TECHNICAL FIELD

This disclosure relates to semiconductor light emitting devices, and particularly relates to a semiconductor light emitting device including light emitting elements.

This application is a 2018 research entrusted by New Energy and Industrial Technology Development Organization of National Research and Development Agency. "Development of techniques for next-generation laser with high luminance and high efficiency/Development of techniques for novel light sources and elements for next-next-generation processing/Development of GaN-based high output and high beam-quality semiconductor laser for highly efficient processing", and is a patent application to which Article 19 of Industrial Technology Enhancement Act is applied.

BACKGROUND ART

Recently, high output projectors have been developed accompanied by prevalence of projection mapping and increasing use of projectors in large facilities such as stadiums. To implement high output projectors, semiconductor light emitting devices such as semiconductor laser devices, which are readily combined with an optical system, are used as a light source. To increase the output of the semiconductor light emitting device, it is essential to reduce the thermal resistance of the semiconductor light emitting device. Methods of reducing the thermal resistance of the semiconductor light emitting device include a use of a multi-emitter configuration where a plurality of light emitting elements (i.e., emitters) is disposed. In a semiconductor light emitting device having such a multi-emitter configuration, the light emitting elements serving as heat sources can be dispersed, thereby reducing the thermal resistance of the semiconductor light emitting device. When a high output operation is performed in such a semiconductor light emitting device having a multi-emitter configuration, a difference in temperature is generated among the light emitting elements, leading to uneven emission wavelengths among the light emitting elements attributed to the difference in temperature. This results in a reduction in wavelength uniformity of the light source, and thus a reduction in color reproductivity of the projector.

A conventional technique of reducing such a difference in temperature among emitters will be described with reference to FIG. 10. FIG. 10 is a block diagram illustrating a conventional semiconductor array laser device, which is described in PTL 1. As illustrated in FIG. 10, in the semiconductor array laser device described in PTL 1, laser chip 1000 includes light emitting elements arranged into an array, and the top surface and the bottom surface thereof are configured of p-side electrode 1001 and n-side electrode 1007, respectively. Two heat sinks 1009 and 1010 are disposed on the top and bottom surfaces, respectively, with solder layer 1008 interposed. Use of such a configuration aims to improve the heat dissipating effect in the semiconductor array laser device described in PTL 1, compared to the case where laser chip 1000 is supported by only a single heat sink. Furthermore, in the semiconductor array laser device disclosed in PTL 1, the central portion of substrate 1006 in laser chip 1000 has a reduced thickness. In other words, a surface of substrate 1006 close to n-side electrode 1007 has a concave shape. Such a configuration can reduce the thermal resistance of the central portion, which reaches a relatively high temperature out of laser chip 1000, providing uniformity of the temperature during the operation of laser chip 1000. Thus, in the semiconductor array laser device disclosed in PTL 1, it is attempted to provide the uniformity of the emission wavelength among the light emitting elements by controlling the temperature during the operation of laser chip 1000 to be uniform.

CITATION LIST

PTL 1: Japanese Unexamined Patent Application Publication No. 1992-192483

SUMMARY OF THE INVENTION

Technical Problems

The semiconductor array laser device described in PTL 1 presumes not only a heat dissipating path through the surface of laser chip 1000 close to substrate 1006 but also that through the surface thereof close to an active layer (the surface close to p-side electrode 1001 illustrated in FIG. 10). For this reason, a package where the top and bottom surfaces of laser chip 1000 are sandwiched between two heat sinks 1009 and 1010 is essential, leading to an increase in cost needed for packaging and mounting. There are technical difficulties in precisely matching the concave shape of substrate 1006 and the convex shape of heat sink 1010. A deviation generated between the concave shape of substrate 1006 and the convex shape of heat sink 1010 may increase the thickness of solder layer 1008 interposed therebetween, obstructing the effects of the uniform temperature. Thus, the uniformity of the emission wavelength of the light emitting elements may not be provided in the semiconductor array laser device described in PTL 1 in some cases.

The present disclosure has been made to solve such problems. An object of the present disclose is to provide a semiconductor light emitting device including light emitting elements having enhanced uniformity of the emission wavelength.

Solutions to Problems

To solve the above problems, the semiconductor light emitting device according to one aspect of the present disclosure includes a substrate; and an array including three or more light emitting elements which are aligned above and along a main surface of the substrate and each emit light. The three or more light emitting elements each include a clad layer of a first conductivity type, an active layer containing In, and a clad layer of a second conductivity type disposed above the substrate sequentially from the substrate. Among the three or more light emitting elements, a compositional ratio of In in the active layer is smaller in a light emitting element located in a central area in an alignment direction than in light emitting elements located in both end areas in the alignment direction.

When the compositional ratio of In in the active layer is varied according to the light emitting elements as described above and the semiconductor light emitting device is operated at low output such that the influences by heat generation in the active layer on the emission wavelength are negligible, the emission wavelength shifts to a shorter wavelength range as the compositional ratio of In in the active layer is smaller. In contrast, when the temperature of the active layer increases, the emission wavelength shifts to a longer wavelength range. For this reason, the uniformity of the emission wavelength among the light emitting elements can be enhanced by disposing the active layer having a relatively small compositional ratio of In in the central region in the alignment direction which reaches a relatively high temperature during the operation. Thus, a semiconductor light emitting device having high wavelength uniformity during the operation can be implemented. Furthermore, in the semiconductor light emitting device according to one aspect of the present disclosure, the heat dissipating configuration may be a configuration which enables the light emitting elements to dissipate heat to a similar extent, and the configuration including a heat sink on both surfaces of the device as described in PTL 1 is not always needed. For example, the effect of providing the uniformity of the emission wavelength can also be obtained by a heat dissipating configuration including a heat sink on only one of main surfaces of the substrate in the semiconductor light emitting device according to the present disclosure. Accordingly, the present disclosure can simplify the heat dissipating configuration and reduce cost.

In the semiconductor light emitting device according to one aspect of the present disclosure, the active layer may have a quantum well structure including a well layer and a barrier layer. Among the three or more light emitting elements, a compositional ratio of In in the well layer may be smaller in the light emitting element located in the central area in the alignment direction than in the light emitting elements located in both end areas in the alignment direction.

In such a case where the active layer has a quantum well structure including the well layer and the barrier layer, the non-uniformity of the emission wavelength among the light emitting elements can be reduced by disposing a well layer having a relatively small compositional ratio of In in the central region in the alignment direction which reaches a relatively high temperature during the operation. Thus, a semiconductor light emitting device having high uniformity of the wavelength during the operation can be implemented.

In the semiconductor light emitting device according to one aspect of the present disclosure, among the three or more light emitting elements, an off angle of the substrate in a region including the light emitting element located in the central area in the alignment direction may be smaller than an off angle of the substrate in regions including the light emitting elements located in both end areas in the alignment direction.

In such a semiconductor light emitting device, a smaller off angle of the substrate results in a smaller compositional ratio of In in the semiconductor layer laminated above the substrate. For this reason, the semiconductor light emitting device including the semiconductor layer laminated above the substrate can facilitate the implementation of a configuration where the compositional ratio of In in the active layer is smaller in the central area in the alignment direction than in both end areas in the alignment direction.

Advantageous Effects of Invention

The present disclosure can provide a semiconductor light emitting device including light emitting elements having a uniform emission wavelength.

DESCRIPTION OF EXEMPLARY EMBODIMENTS

Figure 1:
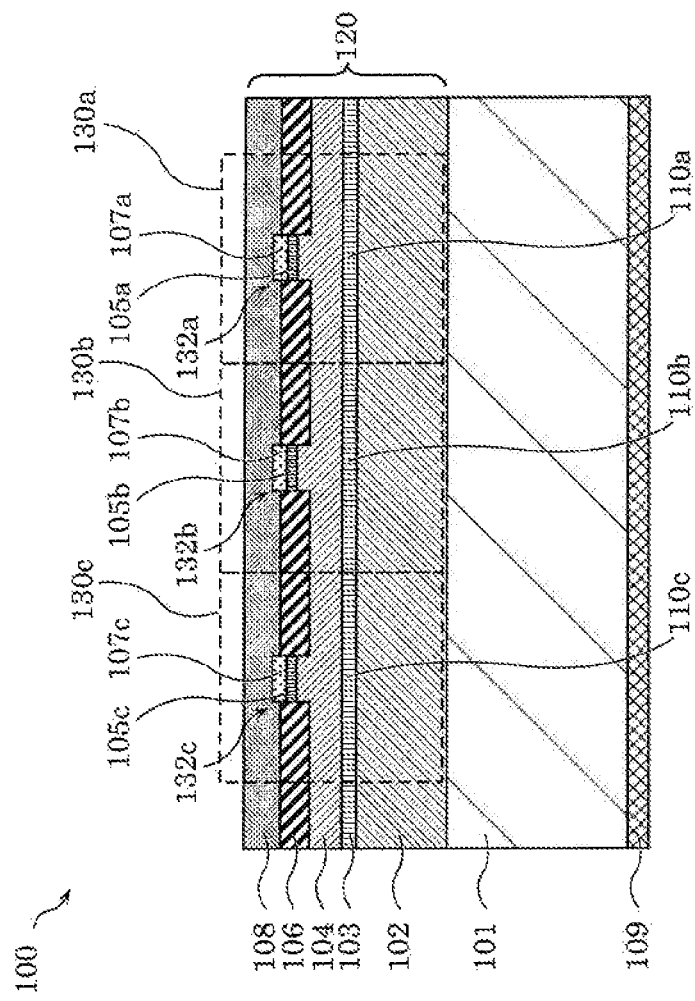
FIG. 1 is a schematic sectional view illustrating the semiconductor light emitting device according to Embodiment 1.

The embodiments according to the present disclosure will now be described with reference to the drawings. The embodiments described below all illustrate specific examples of the present disclosure. Accordingly, numeric values, shapes, materials, components, and arrangements, positions, and connection forms of the components illustrated in the following embodiments are exemplary, and should not be construed as limitations to the present disclosure. Among the components of the following embodiments, the components not described in an independent claim representing the most superordinate concept of the present disclosure are described as arbitrary components.

The drawings are schematic views, and are not always strictly illustrated. Accordingly, the scale is not always consistent among the drawings. In the drawings, identical referential numerals are given to substantially identical configurations, and the duplication of the description thereof will be omitted or simplified.

In this specification, terms "upper" and "lower" do not represent upper (vertically upper) and lower (vertically lower) directions in absolute spatial recognition, and are used as terms defined by relative positional relations based on the lamination order of a laminate structure. Moreover, the terms "upper" and "lower" are also used not only in the case where two components are arranged at an interval and another component is interposed between the two components, but also in the case where the two components are arranged in contact with each other.

Embodiment 1

The semiconductor light emitting device according to Embodiment 1 will be described.
[1-1. Entire Configuration]

Figure 2:
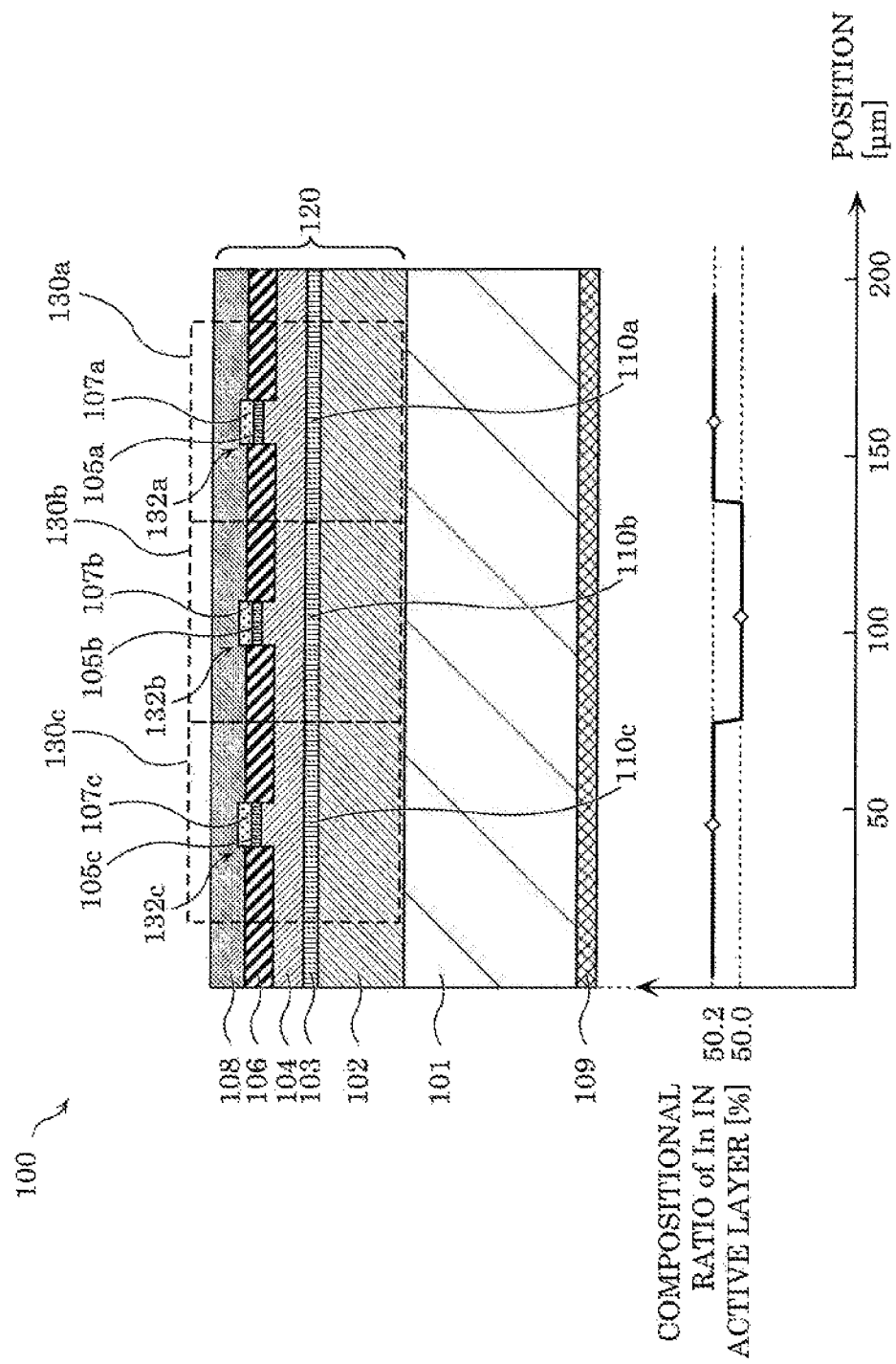
FIG. 2 is a graph showing a distribution of the compositional ratio of In in a well layer in the active layer according to Embodiment 1.

First, the entire configuration of the semiconductor light emitting device according to the present embodiment will be described with reference to FIGS. 1 and 2. FIG. 1 is a schematic sectional view illustrating semiconductor light emitting device 100 according to the present embodiment. FIG. 2 is a graph showing a distribution of the compositional ratio of In in a well layer in active layer 108 according to the present embodiment. FIG. 2 also shows a cross-section of semiconductor light emitting device 100 in a position corresponding to the abscissa of the graph. The position in the abscissa of the graph shown in FIG. 2 corresponds to a position in the horizontal direction of the cross-sectional view shown thereabove. For example, a position of 0 μm in the abscissa of the graph shown in FIG. 2 corresponds to the leftmost position of active layer 103 in the cross-sectional view, and a position of 200 μm in the abscissa of the graph corresponds to the rightmost position of active layer 103 in the cross-sectional view. In FIG. 2 and the following description, the compositional ratio of In in the well layer in active layer 103 is also simply referred to as "compositional ratio of In in the active layer".

Semiconductor light emitting device 100 is an array-type light emitting device including three or more light emitting elements each including a light-emitting layer made of a semiconductor. In the present embodiment, semiconductor light emitting device 100 is a laser device having a light emitting end surface and a light reflecting end surface (both end surfaces are not illustrated) which define an optical cavity. FIG. 1 illustrates a cross-section vertical to the resonating direction of semiconductor light emitting device 100.

As illustrated in FIG. 1, semiconductor light emitting device 100 includes substrate 101 and array 120. In the present embodiment, semiconductor light emitting device 100 further includes first conductive-side electrode 109.

Substrate 101 is a substrate of semiconductor light emitting device 100. In the present embodiments, substrate 101 is an n-type GaAs substrate having a thickness of 80 μm.

Array 120 includes three or more light emitting elements which are aligned above and along a main surface of substrate 101 and each emit light. In the present embodiment, as illustrated in FIG. 1, array 120 includes three light emitting elements 130a, 130b, and 130c Array 120 can include any number of light emitting elements, and may include at least three light emitting elements. Hereinafter, the direction of alignment in array 120 (the horizontal direction in FIG. 1) is referred to as alignment direction.

Three light emitting elements 130a, 130b, and 130c each include clad layer 102 of a first conductivity type, active layer 103 containing In, and clad layer 104 of a second conductivity type disposed above substrate 101 sequentially from substrate 101. In the present embodiment, three light emitting elements 130a, 130b, and 130c include contact layers 106a, 105b, and 105c and second conductive-side electrodes 107a, 107b, and 107c, respectively. Three light emitting elements 130a, 130b, and 130c further include insulating layer 106 and pad electrode 108.

Clad layer 102 of a first conductivity type is a clad layer disposed above substrate 101. In the present embodiment, clad layer 102 of a first conductivity type is an n-type $(Al_xGa_{1-x})_{1-y}In_yP$ (where x=0.6 and y=0.5) clad layer having a thickness of 1 μm. Clad layer 102 of a first conductivity type can have any other configuration. Clad layer 102 of a first conductivity type may have a thickness of more than 1 μm, or its composition may be an n-type $(Al_xGa_{1-x})_{1-y}In_yP$ (where 0<x<1 and 0<y<1).

Active layer 103 is a light-emitting layer disposed above clad layer 102 of a first conductivity type. In the present embodiment, active layer 103 is a quantum well active layer including a laminate of an undoped $In_xGa_{1-x}P$ (where x=0.500 or x=0.502) well layer having a thickness of 10 nm and an undoped $(Al_xGa_{1-x})_{1-y}In_yP$ (where x=0.4 and y=0.5) barrier layer having a thickness of 100 nm, the well layer and the barrier layer being alternately laminated.

Among the three or more light emitting elements in semiconductor light emitting device 100, the compositional ratio of In in active layer 103 is smaller in the light emitting element located in the central area in the alignment direction than in the light emitting elements located in both end areas in the alignment direction. In the present embodiment, as illustrated in FIG. 2, the compositional ratio of In in active layer 103 is smaller in light emitting element 130b located in the central area in the alignment direction than in light emitting elements 130a and 130c located in both end areas in the alignment direction. Specifically, the compositional ratio of In in the well layer in active layer 103 is 0.500 (i.e., 50.0%) in light emitting element 130b and is 0.502 (i.e., 50.2%) in light emitting elements 130a and 130c. In other words, the composition of the well layer in active layer 103 is an undoped $In_xGa_{1-x}P$ (where x=0.5) in light emitting element 130b, and is an undoped $In_xGa_{1-x}P$ (where x=0.502) in light emitting elements 130a and 130c.

Semiconductor light emitting device 100 including such an active layer 103 can emit red laser light having a wavelength of about 640 nm. Active layer 103 can have any other configuration, and may be a quantum well active layer including a laminate of an InGaP well layer and an $(Al_xGa_{1-x})_{1-y}In_yP$ (where 0<x<1 and 0<y<1) barrier layer, the well layer and the barrier layer being alternately laminated. Out of active layer 103, emitters 110a, 110b, and 110c emit light, the emitters corresponding to current passage regions, that is, the lower regions of ridges 132a, 132b, and 132c. Moreover, active layer 103 may include a guide layer disposed at least above or below the quantum well active layer.

As illustrated in FIG. 1, clad layer 104 of a second conductivity type is a clad layer disposed above active layer 103. In the present embodiment, clad layer 104 of a second conductivity type is a p-type $(Al_xGa_{1-x})_{1-y}In_yP$ (where x=0.6 and y=0.5) layer having a thickness of 0.5 μm. Clad layer 104 of a second conductivity type can have any other configuration. Clad layer 104 of a second conductivity type may have a thickness of 0.5 μm or more and 1.0 μm or less, and its composition may be a p-type $(Al_xGa_{1-x})_{1-y}In_yP$ (where 0<x<1 and 0<y<1).

Contact layers 105a, 105b, and 105c are disposed above clad layer 104 of a second conductivity type, and are in ohmic contact with second conductive-side electrodes 107a, 107b, and 107c, respectively. In the present embodiment, contact layers 105a, 105b, and 105c are p-type GaAs layers having a thickness of 100 nm. Contact layers 105a, 105b, and 105e can have any other configuration. Contact layers 105a, 105b, and 105c may have a thickness of 100 nm or more and 500 nm or less.

Insulating layer 106 is disposed above clad layer 104 of a second conductivity type to insulate pad electrode 108 from clad layer 104 of a second conductivity type and contact layers 105a, 105b, and 105e. Insulating layer 106 covers the top surface of clad layer 104 of a second conductivity type excluding ridges 132a, 132b, and 132c, lateral surfaces of ridges 132a, 132b, and 132c in clad layer 104 of a second conductivity type, and lateral surfaces of contact layers 105a, 105b, and 105c. Insulating layer 106 may cover part of the top surfaces of contact layers 105a, 105b, and 105c. Insulating layer 106 includes openings above ridges 132a, 132b, and 132c to bring contact layers 105a, 105b, and 105c into contact with second conductive-side electrodes 107a, 107b, and 107c. The opening of insulating layer 106 may have a slit-like shape. In the present embodiment, insulating layer 106 is a $SiO_2$ layer having a thickness of 300 nm. Insulating layer 106 may have any other configuration. Insulating layer 106 may have a thickness of 100 nm or more and 1000 nm or less.

Second conductive-side electrodes 107a, 107b, and 107c are disposed above contact layers 105a, 105b, and 105c to be in ohmic contact with contact layers 105a, 105b, and 105c, respectively. Second conductive-side electrodes 107a, 107b, and 107c are disposed above ridges 132a, 132b, and 132c, respectively. In other words, second conductive-side electrodes 107a, 107b, and 107c are disposed in the openings of insulating layer 106. Second conductive-side electrodes 107a, 107b, and 107c may be disposed above insulating layer 106. Second conductive-side electrodes 107a, 107b, and 107c are in contact with contact layers 105a, 105b, and 105c in the openings of insulating layer 106, respectively. In the present embodiment, second conductive-side electrodes 107a, 107b, and 107c each are a laminate film of Cr, Pt, and Au disposed sequentially from the corresponding one of contact layers 105a, 105b, and 105c. Second conductive-side electrodes 107a, 107b, and 107c can have any other configuration. Second conductive-side electrodes 107a, 107b, and 107c may be a monolayer film or multi-layer film made of at least one of Cr, Ti, Ni, Pd, Pt, and Au, for example.

Pad electrode 108 is a pad-like electrode disposed above second conductive-side electrodes 107a, 107b, and 107c. In the present embodiment, pad electrode 108 is a laminate film of Ti and Au disposed sequentially from second conductive-side electrodes 107a, 107b, and 107c, and is disposed above ridges 132a, 132b, and 132c and insulating layer 106. Pad electrode 108 can have any other configuration. Pad electrode 108 may be a laminate film of Ti, Pt, and Au or a laminate film of Ni and Au, for example.

First conductive-side electrode 109 is an electrode disposed below substrate 101. In the present embodiment, first conductive-side electrode 109 is a laminate film of a AuGeNi alloy and Au disposed sequentially from substrate 101. First conductive-side electrode 109 can have any configuration. First conductive-side electrode 109 may be made of another conductive material.

[1-2. Mount Form]

Figure 3:
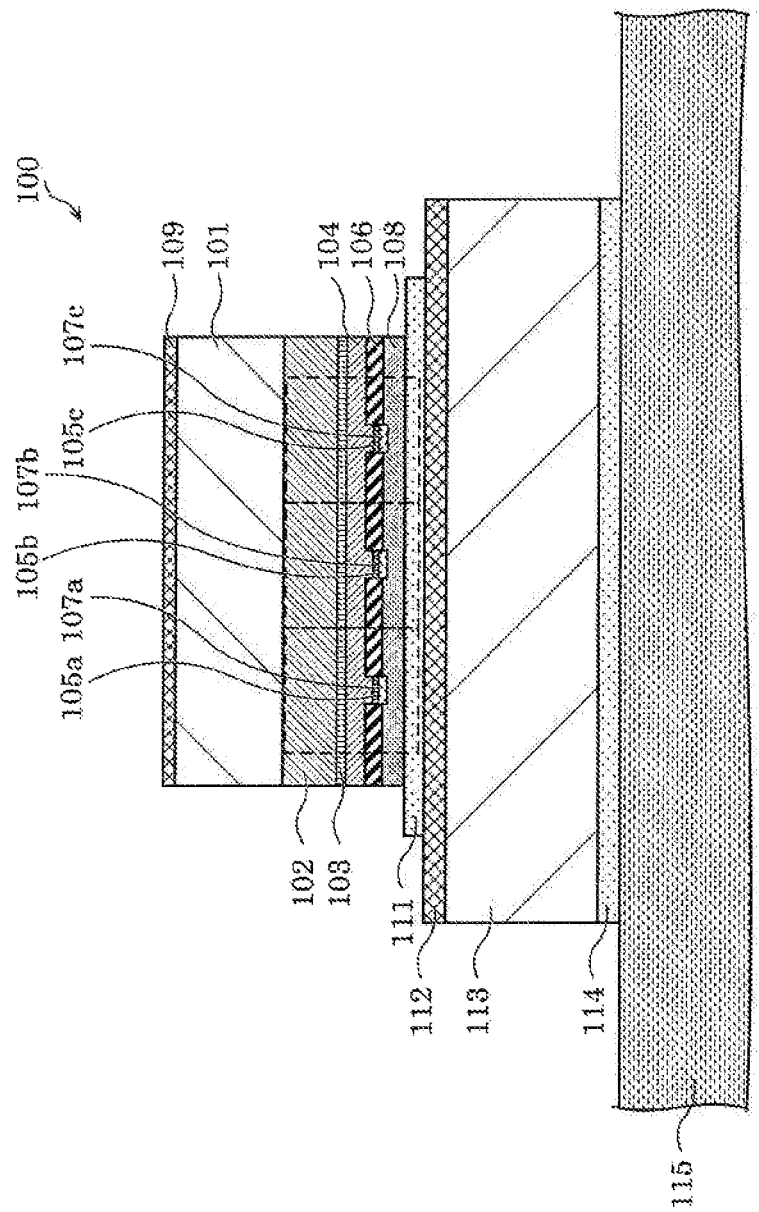
FIG. 3 is a schematic sectional view illustrating one example of a mount form of the semiconductor light emitting device according to Embodiment 1.

Next, the mount form of semiconductor light emitting device 100 according to the present embodiment will be described with reference to FIG. 3. FIG. 3 is a schematic sectional view illustrating one example of the mount form of semiconductor light emitting device 100 according to the present embodiment.

As illustrated in FIG. 3, semiconductor light emitting device 100 is mounted on package 115 through submount 113 in one example of the mount form. In an example illustrated in FIG. 3, the surface of semiconductor light emitting device 100 close to pad electrode 108 is mounted on submount 113.

Submount 113 is a member having a polyhedral shape, and semiconductor light emitting device 100 is fixed onto one of its surfaces. In the present embodiment, submount 113 has a cuboidal shape. Submount 113 is formed of a material having a thermal conductivity higher than those of the semiconductor layers in semiconductor light emitting device 100, and functions as a heat sink for semiconductor light emitting device 100. Semiconductor light emitting device 100 is fixed onto submount 113 with metal layer 112 and adhesive layer 111 close to the device. Submount 113 is bonded to package 115 with adhesive layer 114 close to the package. In the present embodiment, submount 113 is made of a polycrystal diamond having a thickness of 300 μm. Submount 113 can be made of any other material, such as AlN, SiC, CuW, copper diamond, or silver diamond.

Metal layer 112 is a conductive member to which a wire for feeding electricity to pad electrode 108 is connected. In the present embodiment, metal layer 112 is a laminate film of Ti, Pt, and Au sequentially disposed from submount 113, and has a thickness of 5 μm. Metal layer 112 can have any other configuration. Metal layer 112 may be a monolayer film or a laminate film having a thickness of 1 μm or more and 10 μm or less and containing at least one of Ti, Ni, Pt, and Au, for example.

Adhesive layer 111 close to the device is a conductive adhesive member which bonds submount 113 to semiconductor light emitting device 100. In the present embodiment, adhesive layer 111 close to the device is formed of AuSn to have a thickness of 2 μm. Adhesive layer 111 close to the device can be formed of any other material, which may be another conductive adhesive material. Adhesive layer 111 close to the device can also have any other thickness than 2 μm, and the thickness may be appropriately determined.

Adhesive layer 114 close to the package is a member which bonds submount 113 to package 115. In the present embodiment, adhesive layer 114 close to the package is formed of AuSn to have a thickness of 2 μm. Adhesive layer 114 close to the package can be formed of any other material, which may be another conductive adhesive material. Adhesive layer 114 close to the package can also have any other thickness than 2 μm, and the thickness may be appropriately determined.

Package 115 is a member in which semiconductor light emitting device 100 is mounted. Package 115 may be a CAN package, for example. In the present embodiment, package 115 is made of Cu and Fe, for example.

As described above, in this mount form, semiconductor light emitting device 100 is mounted on the surface of submount 113 close to the emitters, submount 113 functioning as a heat sink. For this reason, the heat which generates from semiconductor light emitting device 100 can be efficiently dissipated to submount 113.

[1-3. Action and Effects]

Figure 4:
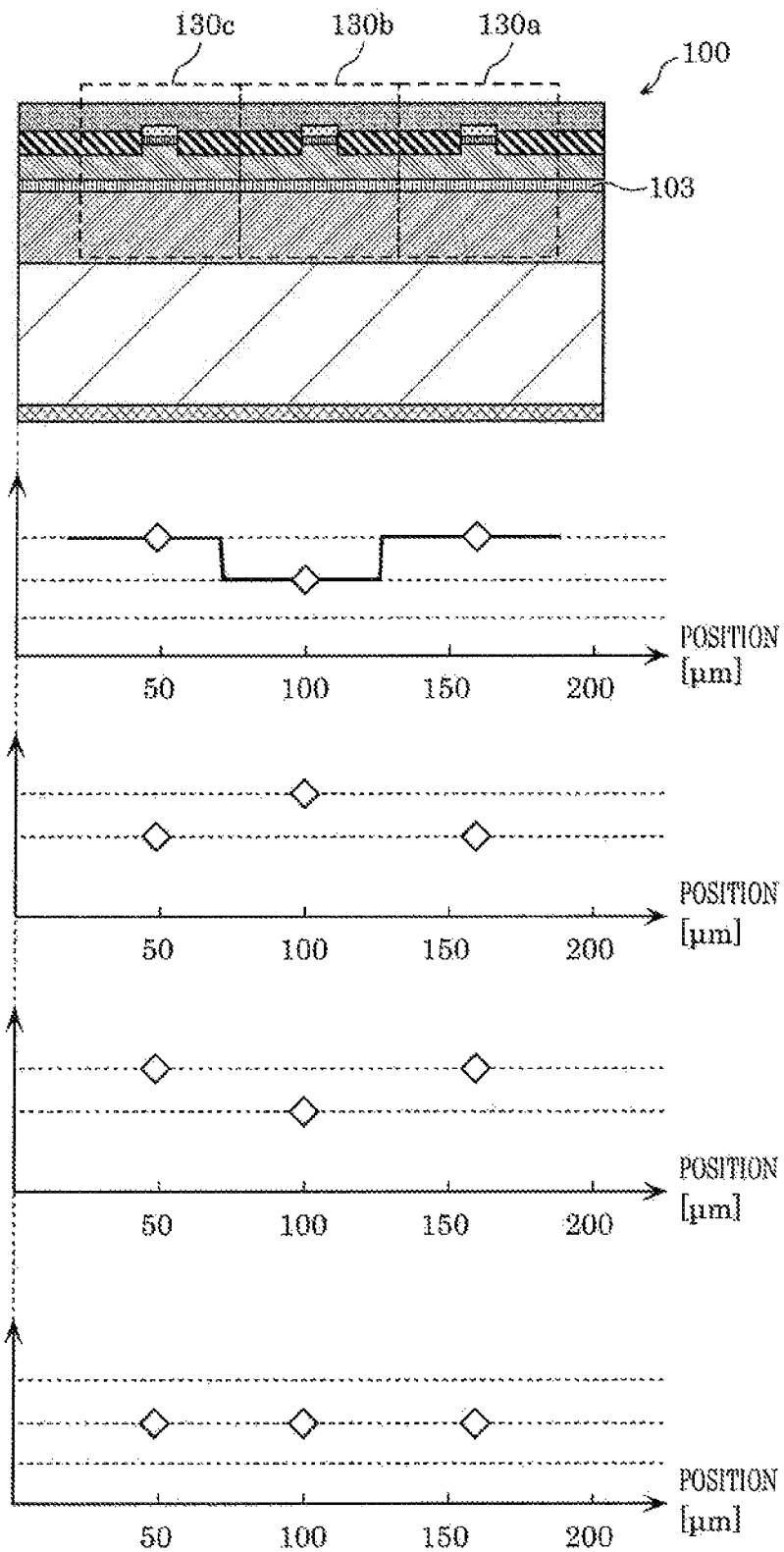
FIG. 4 is a graph showing a distribution of the emission wavelength of the semiconductor light emitting device according to Embodiment 1 plotted against the position of the active layer.
Figure 5:
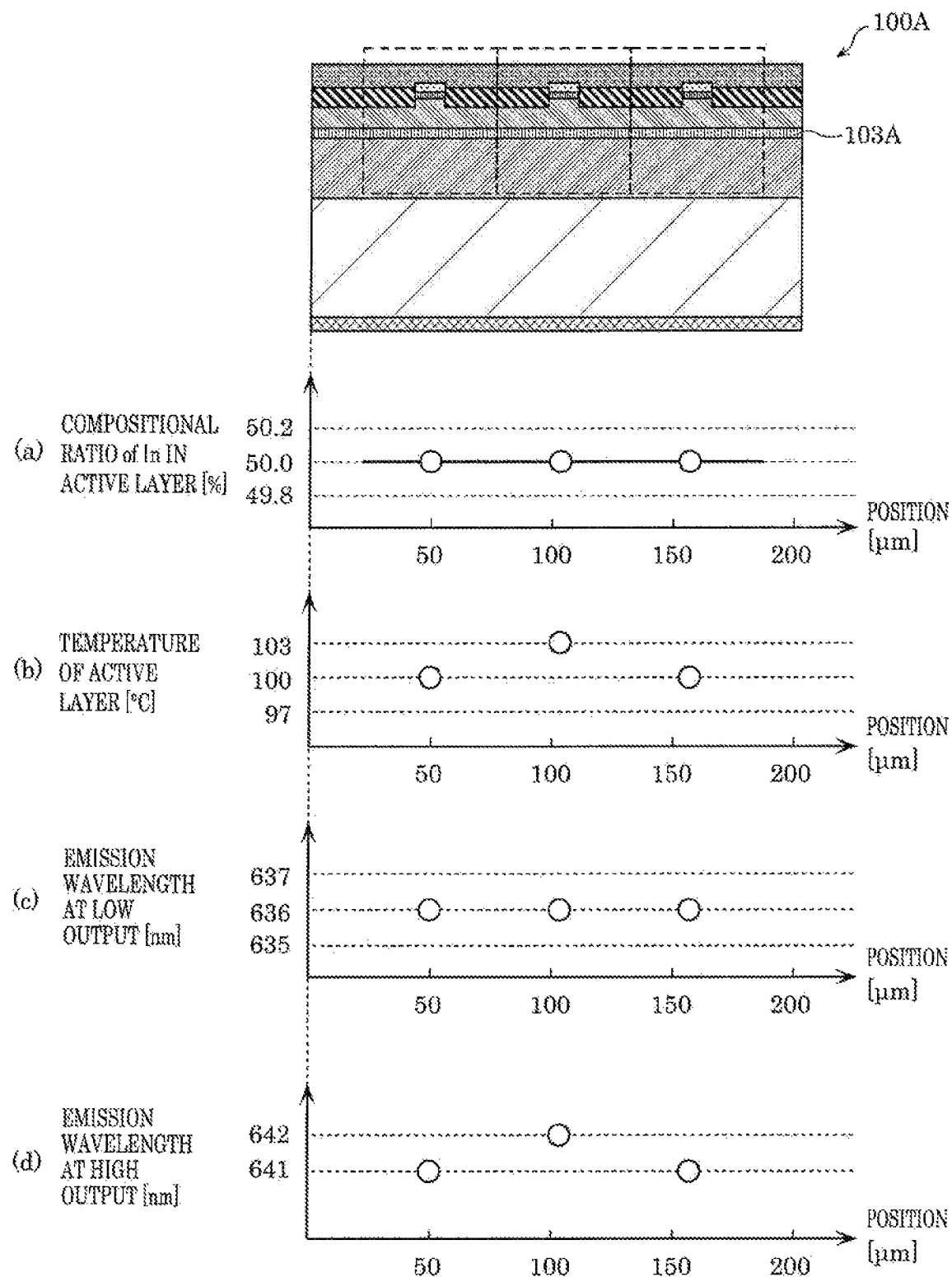
FIG. 5 is a graph showing a distribution of the emission wavelength of a semiconductor light emitting device according to Comparative Example plotted against the position of the active layer.

The action and effects of semiconductor light emitting device 100 according to the present embodiment will now be described with reference to FIGS. 4 and 5. FIGS. 4 and 5 are graphs illustrating distributions of emission wavelengths of the semiconductor light emitting devices according to the present embodiment and Comparative Example plotted against the positions of the active layers, respectively. Semiconductor light emitting device 100 according to the present embodiment and semiconductor light emitting device 100A according to Comparative Example are identical except that semiconductor light emitting device 100A according to Comparative Example includes active layer 103A having a uniform compositional ratio of In. FIGS. 4 and 5 each illustrate a graph (c) illustrating the distribution of the emission wavelength during the low output operation of the semiconductor light emitting device (i.e., peak wavelength of naturally emitted light), and a graph (d) illustrating the distribution of the emission wavelength during the high output operation thereof. Here, the low output operation means the operation having so low output that influences by heat generation in the semiconductor light emitting device are negligible, and the high output operation means a normal operation where the semiconductor light emitting device operates at a rating output, for example. In addition, FIGS. 4 and 5 each illustrate the cross-sectional view of the semiconductor light emitting device, where graph (a) illustrates the distribution of the compositional ratio of In in the well layer in the active layer, and graph (b) illustrates the distribution of the temperature of the active layer during normal operation of the semiconductor light emitting device (i.e., during the high output operation). In FIGS. 4 and 5, similarly to FIG. 2, the position on the abscissa of the graph corresponds to the position in the horizontal direction in the cross-sectional view shown above.

As illustrated in graph (a) of FIG. 5, semiconductor light emitting device 100A according to Comparative Example has a uniform compositional ratio of In in active layer 103A. In such a configuration, as illustrated in graph (c) of FIG. 5, the emission wavelength is uniform across active layer 103A during the low output operation where the influences by heat generated in active layer 103A are negligible. However, the influences of heat generation cannot be neglected during the normal operation. As illustrated in graphs (b) of FIGS. 4 and 5, the light emitting element located in the central area in the alignment direction in each semiconductor light emitting device more significantly receives thermal interference from other adjacent light emitting elements in the alignment direction than those located in both end areas in the alignment direction do. Although such thermal interference can be partially reduced by the mount form illustrated in FIG. 3, it is very difficult to completely eliminate the thermal interference. For this reason, the temperature of the active layer is higher in the light emitting element located in the central area in the alignment direction than in the light emitting elements located in both end areas in the alignment direction during the normal operation. In the active layers of the semiconductor light emitting devices according to the present embodiment and Comparative Example, as illustrated in graph (b) of FIGS. 4 and 5, the temperature of the active layer in the light emitting element located in the central area in the alignment direction is about 3° C. higher than that in the light emitting elements located in both end areas in the alignment direction.

Because active layer 103A during the normal operation has such a temperature distribution, as illustrated in graph (d) of FIG. 5, in active layer 103A of semiconductor light emitting device 100A according to Comparative Example, the shift amount of the emission wavelength attributed to an increase in temperature varies according to the positions in the alignment direction of the three light emitting elements. Thus, the emission wavelength is not uniform for the position of active layer 103A.

In contrast, in the present embodiment, as illustrated in graph (a) of FIG. 4, the compositional ratio of In in active layer 103 is smaller in light emitting element 130b located in the central area in the alignment direction than in light emitting elements 130a and 130c located in both end areas in the alignment direction. Thus, as illustrated in graph (c) of FIG. 4, the emission wavelength is not uniform for the position of active layer 103 during the low output operation where the influences by heat in semiconductor light emitting device 100 according to the present embodiment are negligible. As described above, however, in semiconductor light emitting device 100 during the normal operation, the temperature of active layer 103 is higher in light emitting element 130b located in the central area in the alignment direction than in light emitting elements 130a and 130c located in both end areas in the alignment direction. For this reason, the shift amount of the emission wavelength to the longer wavelength is increased in active layer 103 of light emitting element 130b located in the central area in the alignment direction. As a result, at least part of the difference in shift amount of the emission wavelength attributed to the difference between the temperature of active layer 103 in light emitting element 130b located in the central area in the alignment direction and that in light emitting elements 130a and 130c located in both end areas in the alignment direction can be cancelled out by the difference in emission wavelength attributed to the compositional ratio of In. Accordingly, as illustrated in graph (d) of FIG. 4, the uniformity of the emission wavelength in three light emitting elements 130a, 130b, and 130c of semiconductor light emitting device 100 can be enhanced.

Furthermore, semiconductor light emitting device 100 according to the present embodiment can have any heat dissipating configuration as long as the configuration enables heat dissipation from the light emitting elements to the same extent, and does not always need to have a configuration including a heat sink disposed on both surfaces of the device as described in PTL 1. For example, as illustrated in FIG. 3, the effect of providing the uniform emission wavelength can also be obtained by a heat dissipating configuration in which a heat sink such as submount 113 is disposed only one of the main surfaces of substrate 101 in light emitting device 100. Accordingly the present embodiment can provide a simplified heat dissipating configuration with low cost.

In the present embodiment, active layer 103 has the quantum well structure including the well layer and the barrier layer, and the compositional ratio of In in the well layer is smaller in light emitting element 130b located in the central area in the alignment direction than in light emitting elements 130a and 130c located in both end areas in the alignment direction. Thus, the uniformity of the emission wavelength can be enhanced in active layer 103 having such a quantum well structure.

[1-4. Production Method]

The method of producing semiconductor light emitting device 100 according to the present embodiment will now be described with reference to FIGS. 6A to 6I. FIGS. 6A to 6I are schematic sectional views illustrating the steps of the method of producing semiconductor light emitting device 100 according to the present embodiment.

Figure 6A:
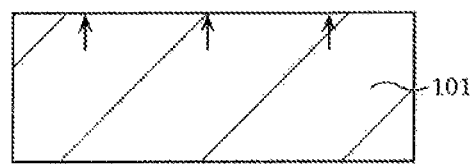
FIG. 6A is a schematic sectional view illustrating a first step of a method of producing the semiconductor light emitting device according to Embodiment 1.

First, substrate 101 including a flat main surface as illustrated in FIG. 6A is prepared. Here, the crystal axis ((100) axis) of substrate 101 is vertical to the main surface of substrate 101 as illustrated by the arrows in FIG. 6A.

Figure 6B:
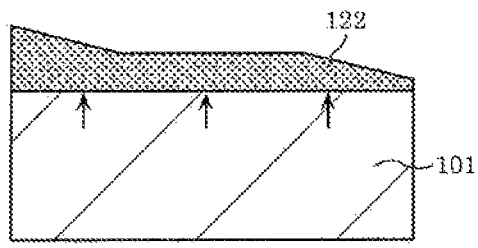
FIG. 6B is a schematic sectional view illustrating a second step of the method of producing the semiconductor light emitting device according to Embodiment 1.

Next, as illustrated in FIG. 6B, resist 122 is applied onto the main surface of substrate 101. Here, the thickness of resist 122 is varied according to the position on substrate 101 by adjusting the exposure quantity during formation of resist 122. Thereby, the thickness of resist 122 is varied in both end areas in the horizontal direction in FIG. 6B linearly (in other words, with a fixed inclination) downward to the right while the thickness of resist 122 is made uniform in the central region in the horizontal direction in FIG. 6B.

Figure 6C:
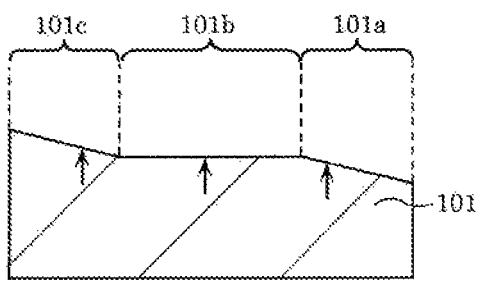
FIG. 6C is a schematic sectional view illustrating a third step of the method of producing the semiconductor light emitting device according to Embodiment 1.

Next, as illustrated in FIG. 6C, the main surface of substrate 101 is etched by the thickness according to the thickness of resist 122 disposed above substrate 101 by removing resist 122 through etching. In this case, as resist 122 formed has a smaller thickness, a larger thickness of substrate 101 is removed through etching. Thus, as illustrated in FIG. 6C, substrate 101 can be formed such that the inclination of the main surface of substrate 101 to the crystal axis, i.e., the off angle is larger in regions 101a and 101c in both end areas of the main surface and is smaller in region 101b in the central area of the main surface.

Figure 6D:
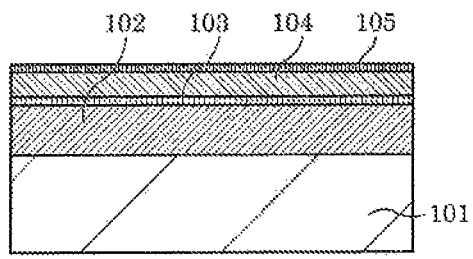
FIG. 6D is a schematic sectional view illustrating a fourth step of the method of producing the semiconductor light emitting device according to Embodiment 1.

Next, as illustrated in FIG. 6D, clad layer 102 of a first conductivity type, active layer 103, clad layer 104 of a second conductivity type, and contact layer 105 are formed above the main surface of substrate 101 sequentially from substrate 101. In FIG. 6D and FIGS. 6E to 6I described later, the inclination of the top surface of substrate 101 illustrated in FIG. 6C is not shown for simplicity of the drawings. In the present embodiment, the layers are formed through metal organic vapor deposition (MOCVD). Here, a smaller off angle of substrate 101 results in a smaller compositional ratio of In in the semiconductor layer laminated above substrate 101. For this reason, when the semiconductor layers above are laminated above substrate 101, the compositional ratio of In in active layer 103 can be reduced in the position where light emitting element 130b is formed in the subsequent steps (the center of the horizontal direction in FIG. 6D), compared to the positions where light emitting elements 130a and 130c are formed (in both end areas in the horizontal direction in FIG. 6D).

Figure 6E:
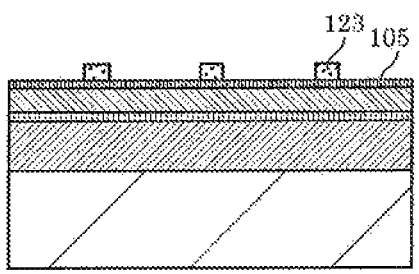
FIG. 6E is a schematic sectional view illustrating a fifth step of the method of producing the semiconductor light emitting device according to Embodiment 1.

Next, as illustrated in FIG. 6E, mask 123 made of $SiO_2$ is formed above contact layer 105. In the present embodiment, a $SiO_2$ film having a thickness of about 300 nm is formed above contact layer 105 through plasma CVD, and the $SiO_2$ film is patterned by photolithography and etching to form three masks 123 of a band shape extending in the resonating direction (i.e., the direction vertical to paper in FIG. 6E).

Figure 6F:
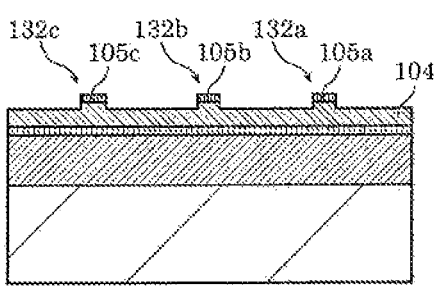
FIG. 6F is a schematic sectional view illustrating a sixth step of the method of producing the semiconductor light emitting device according to Embodiment 1.

Next, as illustrated in FIG. 6F, ridges 132a, 132b, and 132c are formed by etching contact layer 106 and clad layer 104 of a second conductivity type using masks 123 formed into a band shape, and then removing masks 123 through wet etching. Thereby, out of contact layer 105, only contact layers 105a, 105b, and 105c disposed on ridges 132a, 132b, and 132c, respectively, are left while the film thickness of the portions other than the ridges of clad layer 104 of a second conductivity type is reduced. Contact layer 105 and clad layer 104 of a second conductivity type may be etched by dry etching through reactive ion etching (RIE) using a chlorine-based gas such as $Cl_2$. Masks 123 may be removed by wet etching with hydrofluoric acid.

Figure 6G:
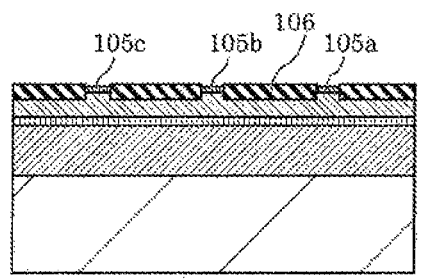
FIG. 6G is a schematic sectional view illustrating a seventh step of the method of producing the semiconductor light emitting device according to Embodiment 1.

Next, insulating layer 106 is formed above clad layer 104 of a second conductivity type and contact layers 105a, 105b, and 105c. Insulating layer 106 is formed of $SiO_2$ through plasma CVD to have a thickness of 300 nm. Subsequently, as illustrated in FIG. 6G, only insulating layer 106 above contact layers 105a, 105b, and 105c is removed to expose the top surfaces of contact layers 105a, 105b, and 105c. Insulating layer 106 can be removed by photolithography and wet etching.

Figure 6H:
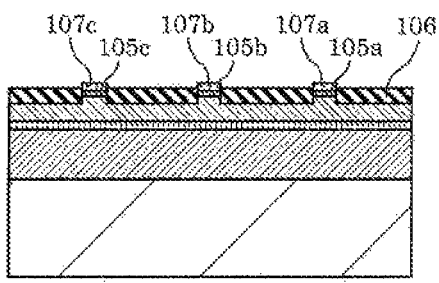
FIG. 6H is a schematic sectional view illustrating an eighth step of the method of producing the semiconductor light emitting device according to Embodiment 1.
Figure 6I:
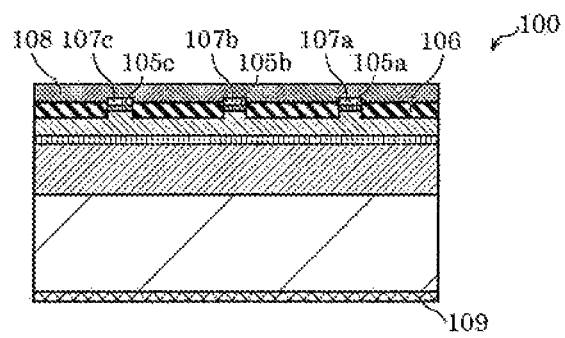
FIG. 6I is a schematic sectional view illustrating a ninth step of the method of producing the semiconductor light emitting device according to Embodiment 1.

Next, as illustrated in FIG. 6H, using a vacuum evaporation process and a lift-off process, second conductive-side electrodes 107a, 107b, and 107c are formed above contact layers 105a, 105b, and 105c, respectively. Subsequently, pad electrode 108 is formed to cover second conductive-side electrodes 107a, 107b, and 107c and insulating layer 106. Specifically, the resist is patterned by photolithography to have a portion where pad electrode 108 is not formed. Pad electrode 108 is formed across the entire surface of substrate 101 by the vacuum evaporation process, and unnecessary portions are removed using the lift-off process. Thus, pad electrode 108 having a predetermined shape is formed. Similarly to pad electrode 108, first conductive-side electrode 109 is formed on the bottom surface of substrate 101 (the lower surface in FIG. 6I). Thus, as illustrated in FIG. 6I, semiconductor light emitting device 100 can be formed.

Among three light emitting elements 130a, 130b, and 130c in semiconductor light emitting device 100 according to the present embodiment, the off angle of substrate 101 in region 101b including light emitting element 130b located in the central area in the alignment direction is smaller than that in regions 101a and 101c including light emitting elements 130a and 130c located in both end areas in the alignment direction. In such a semiconductor light emitting device 100, a smaller off angle of substrate 101 results in a smaller compositional ratio of In in the semiconductor layer laminated above substrate 101. For this reason, semiconductor light emitting device 100 including a laminate structure laminated above substrate 101 can facilitate the implementation of the configuration where the compositional ratio of In in active layer 103 is smaller in the central area in the alignment direction than in both end areas therein.

Embodiment 2

Semiconductor light emitting device according to Embodiment 2 will be described. The semiconductor light emitting device according to the present embodiment is the same as semiconductor light emitting device 100 according to Embodiment 1 except that the materials and the In distribution in the active layer are different. The semiconductor light emitting device according to the present embodiment will now be mainly described for the differences from semiconductor light emitting device 100 according to Embodiment 1.

[2-1. Entire Configuration]

Figure 7:
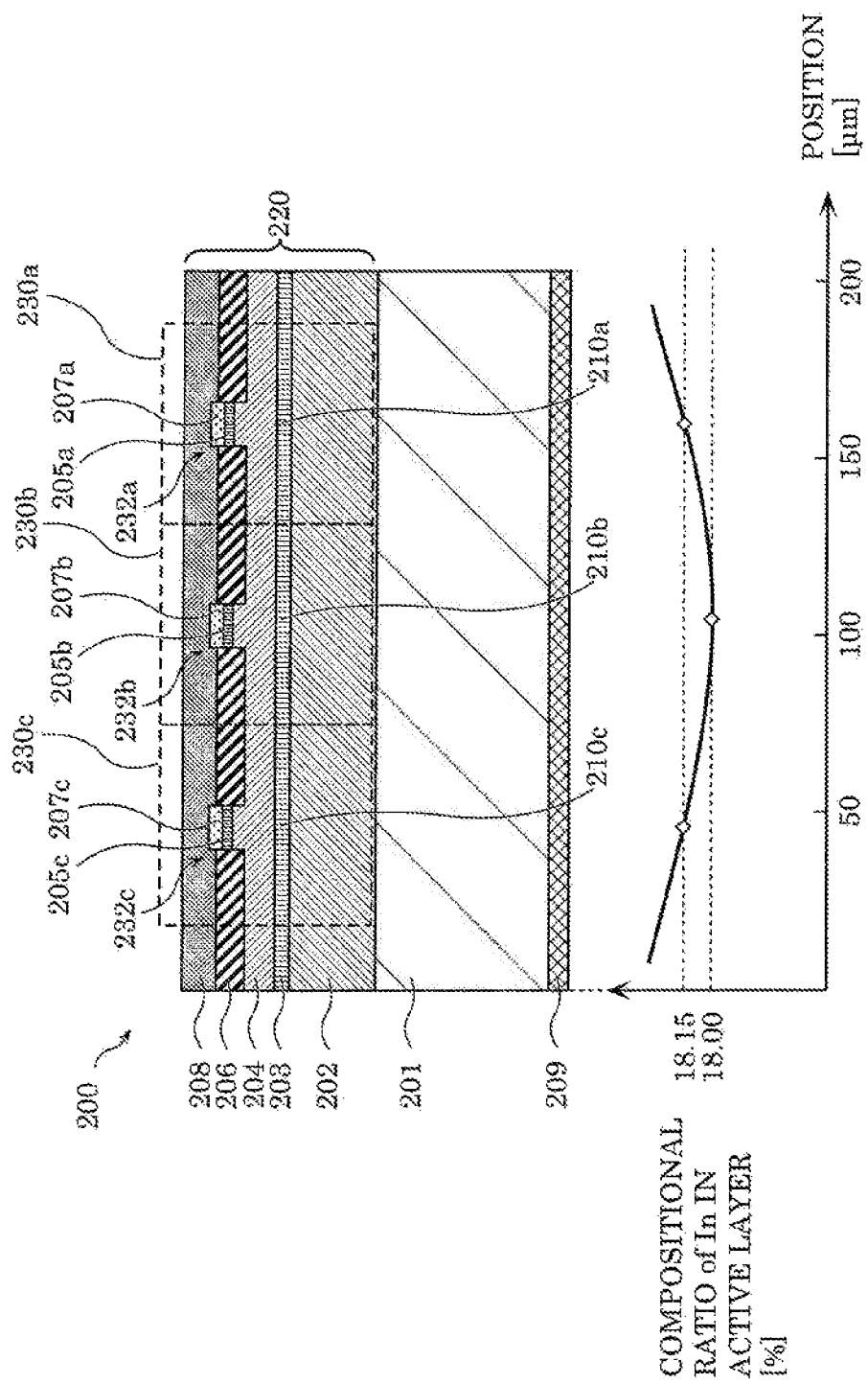
FIG. 7 is a schematic sectional view illustrating the semiconductor light emitting device according to Embodiment 2.

First, the entire configuration of the semiconductor light emitting device according to the present embodiment will be described with reference to FIG. 7. FIG. 7 is a schematic sectional view illustrating semiconductor light emitting device 200 according to the present embodiment. In FIG. 7, a graph is also shown, which illustrates a distribution of the compositional ratio of In in a well layer in active layer 203 according to the present embodiment. The position in the abscissa of the graph shown in FIG. 7 corresponds to a position in the horizontal direction of the cross-sectional view shown thereabove. For example, a position of 0 μm in the abscissa of the graph shown in FIG. 7 corresponds to the leftmost position of active layer 203 in the cross-sectional view, and a position of 200 μm in the abscissa of the graph corresponds to the rightmost position of active layer 203 in the cross-sectional view.

Semiconductor light emitting device 200 according to the present embodiment includes semiconductor layers made of nitride semiconductors. As illustrated in FIG. 7, semiconductor light emitting device 200 includes substrate 201 and array 220. In the present embodiment, semiconductor light emitting device 200 further includes first conductive-side electrode 209.

Substrate 201 is a substrate of semiconductor light emitting device 200. In the present embodiment, substrate 201 is an n-type GaN substrate having a thickness of 80 μm.

Array 220 includes three or more light emitting elements which are aligned above and along a main surface of substrate 201 and each emit light. In the present embodiment, as illustrated in FIG. 7, array 220 includes three light emitting elements 230a, 230b, and 230c. Array 220 can include any number of light emitting elements, and may include at least three light emitting elements.

Three light emitting elements 230a, 230b, and 230c each include clad layer 202 of a first conductivity type, active layer 203 containing In, and clad layer 204 of a second conductivity type disposed above substrate 201 sequentially from substrate 201. In the present embodiment, three light emitting elements 230a, 230b, and 230c include contact layers 205a, 205b, and 205c and second conductive-side electrodes 207a, 207b, and 207c, respectively. Three light emitting elements 230a, 230b, and 230c further include insulating layer 206 and pad electrode 208.

Clad layer 202 of a first conductivity type is a clad layer disposed above substrate 201. In the present embodiment, clad layer 202 of a first conductivity type is an n-type $Al_xGa_{1-x}N$ (where x=0.05) clad layer having a thickness of 1 μm. Clad layer 202 of a first conductivity type can have any other configuration. Clad layer 202 of a first conductivity type may have a thickness of more than 1 μm, or its composition may be an n-type $Al_xGa_{1-x}N$ (where 0<x<1).

Active layer 203 is a light-emitting layer disposed above clad layer 202 of a first conductivity type. In the present embodiment, active layer 203 is a quantum well active layer including a laminate of an undoped $In_xGa_{1-x}N$ (where x≥0.1800) well layer having a thickness of 5 nm and an undoped GaN barrier layer having a thickness of 100 nm, the well layer and the barrier layer being alternately laminated.

Among the three or more light emitting elements in semiconductor light emitting device 200, the compositional ratio of In in active layer 203 is smaller in light emitting element located in the central area in the alignment direction than in the light emitting elements located in both end areas in the alignment direction. In the present embodiment, as illustrated in FIG. 7, the compositional ratio of In in active layer 203 is smaller in light emitting element 230b located in the central area in the alignment direction than in light emitting elements 230a and 230c located in both end areas in the alignment direction. Specifically, the compositional ratio of In in the well layer in active layer 203 is 0.1800 (i.e., 18.00%) in emitter 210b of light emitting element 230b and is 0.1815 (i.e., 18.15%) in emitter 210a of light emitting element 230a and emitter 210c of light emitting element 230c. In the present embodiment, the compositional ratio of In in the well layer in active layer 203 continuously increases from the central area toward both end areas in the alignment direction.

Semiconductor light emitting device 200 including such an active layer 203 emits blue laser light having a wavelength of about 450 nm.

Active layer 203 can have any other configuration, and may be a quantum well active layer including a laminate of an $In_xGa_{1-x}N$ (where 0<x<1) well layer and a GaN barrier layer alternately laminated. Out of active layer 203, emitters 210a, 210b, and 210c emit light, the emitters corresponding to current passage regions, that is, the lower regions of ridges 232a, 232b, and 232c. Moreover, active layer 203 may include a guide layer disposed at least above or below the quantum well active layer.

As illustrated in FIG. 7, clad layer 204 of a second conductivity type is a clad layer disposed above active layer 203. In the present embodiment, clad layer 204 of a second conductivity type is a p-type $Al_xGa_{1-x}N$ (where x=0.05) layer having a thickness of 0.5 μm. Clad layer 204 of a second conductivity type can have any other configuration. Clad layer 104 of a second conductivity type may have a thickness of 0.5 μm or more and 1.0 μm or less, and its composition may be a p-type $Al_xGa_{1-x}N$ (where 0<x<1).

Contact layers 205a, 205b, and 205c are disposed above clad layer 204 of a second conductivity type, and are in ohmic contact with second conductive-side electrodes 207a, 207b, and 207c, respectively. In the present embodiment, contact layers 205a, 205b, and 205c each are a p-type GaN layer having a thickness of 100 rm. Contact layers 205a, 205b, and 205c can have any other configuration. Contact layers 205a, 205b, and 205c may have a thickness of 100 nm or more and 500 nm or less.

Insulating layer 206 is disposed above clad layer 204 of a second conductivity type to insulate pad electrode 108 from clad layer 204 of a second conductivity type and contact layers 205a, 205b, and 205c. Insulating layer 206 covers the top surface of clad layer 204 of a second conductivity type excluding ridges 232a, 232b, and 232c, lateral surfaces of ridges 232a, 232b, and 232c in clad layer 204 of a second conductivity type, and lateral surfaces of contact layers 205a, 205b, and 205c. Insulating layer 106 may cover part of the top surfaces of contact layers 205a, 205b, and 205c. Insulating layer 206 includes openings above ridges 232a, 232b, and 232c to bring contact layers 205a, 205b, and 205c into contact with second conductive-side electrodes 207a, 207b, and 207c. The opening of insulating layer 206 may have a slit-like shape. In the present embodiment, insulating layer 206 is a $SiO_2$ layer having a thickness of 300 nm. Insulating layer 206 can have any other configuration. Insulating layer 206 may have a thickness of 100 nm or more and 1000 nm or less.

Second conductive-side electrodes 207a, 207b, and 207c are disposed above contact layers 205a, 205b, and 205c to be in ohmic contact with contact layers 205a, 205b, and 205c, respectively. Second conductive-side electrodes 207a, 207b, and 207c have the same configuration as that of second conductive-side electrodes 107a, 107b, and 107c according to Embodiment 1, respectively.

Pad electrode 208 is a pad-like electrode disposed above second conductive-side electrodes 207a, 207b, and 207c. Pad electrode 208 has the same configuration as that of pad electrode 108 according to Embodiment 1.

First conductive-side electrode 209 is an electrode disposed below substrate 201. First conductive-side electrode 209 has the same configuration as that of first conductive-side electrode 109 according to Embodiment 1.

As described above, semiconductor light emitting device 200 according to the present embodiment having the distribution of the compositional ratio of In in the well layer in active layer 203 can enhance the uniformity of the emission wavelength among the light emitting elements as in semiconductor light emitting device 100 according to Embodiment 1. In the present embodiment, semiconductor light emitting device 200 having a simplified configuration can also be implemented at low cost as in Embodiment 1.

[2-2. Production Method]

The method of producing semiconductor light emitting device 200 according to the present embodiment will now be described with reference to FIGS. 8A to 8I. FIGS. 8A to 8I are schematic sectional views illustrating the steps of the method of producing semiconductor light emitting device 200 according to the present embodiment.

Figure 8A:
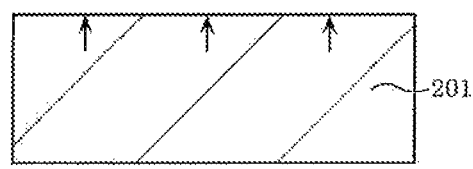
FIG. 8A is a schematic sectional view illustrating a first step of a method of producing the semiconductor light emitting device according to Embodiment 2.

First, substrate 201 including a flat main surface as illustrated in FIG. 8A is prepared. Here, the crystal axis ((100) axis) of substrate 201 is vertical to the main surface of substrate 201 as illustrated by the arrows in FIG. 8A.

Figure 8B:
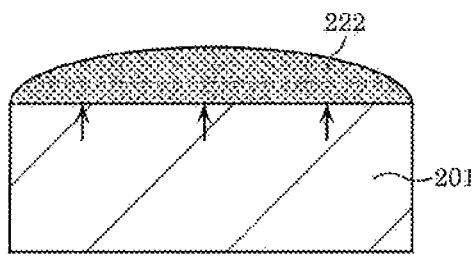
FIG. 8B is a schematic sectional view illustrating a second step of the method of producing the semiconductor light emitting device according to Embodiment 2.

Next, as illustrated in FIG. 8B, resist 222 is applied onto the main surface of substrate 201. Here, the thickness of resist 222 is varied according to the position on substrate 201 by adjusting the exposure quantity during the formation of resist 222. Thereby, the thickness of resist 222 FIG. 8B is decreased from the central area toward both end areas in the horizontal direction.

Figure 8C:
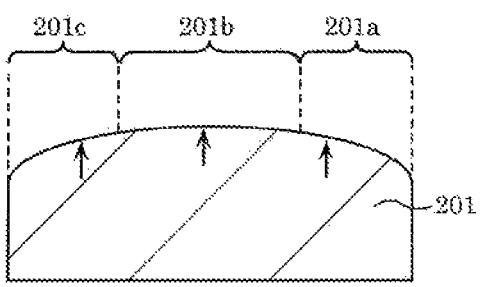
FIG. 8C is a schematic sectional view illustrating a third step of the method of producing the semiconductor light emitting device according to Embodiment 2.

Next, as illustrated in FIG. 8C, the main surface of substrate 201 can be etched by the thickness according to the thickness of resist 222 located above substrate 201 by removing resist 222 through etching. In this case, as resist 222 formed has a smaller thickness, a larger thickness of substrate 201 is removed through etching. Thus, as illustrated in FIG. 8C, substrate 201 can be formed such that the inclination of the main surface of substrate 201 to the crystal axis, i.e., the off angle is larger toward both end areas of substrate 201. Accordingly, substrate 201 can be formed to have a large off angle in regions 201a and 201c in both end areas of the main surface and a small off angle in region 201b in the central area of the main surface.

Figure 8D:
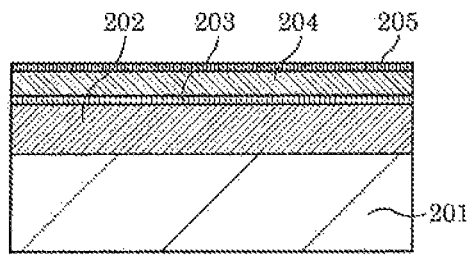
FIG. 8D is a schematic sectional view illustrating a fourth step of the method of producing the semiconductor light emitting device according to Embodiment 2.

Next, as illustrated in FIG. 8D, clad layer 202 of a first conductivity type, active layer 203, clad layer 204 of a second conductivity type, and contact layer 205 are formed above the main surface of substrate 201 sequentially from substrate 201. In FIG. 8D and FIGS. 8E to 8I described later, the inclination of the top surface of substrate 201 illustrated in FIG. 8C is not shown for simplicity of the drawings. The steps illustrated in FIGS. 8D to 8I are the same as those illustrated in FIGS. 6D to 6I, and the detailed descriptions thereof will be omitted.

Figure 8E:
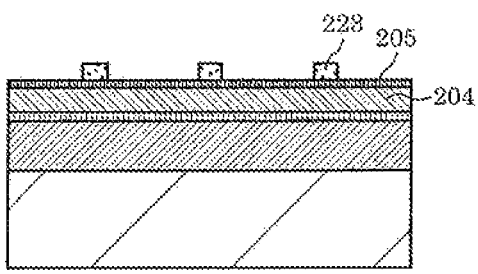
FIG. 8E is a schematic sectional view illustrating a fifth step of the method of producing the semiconductor light emitting device according to Embodiment 2.

Next, as illustrated in FIG. 8E, three band-like masks 223 made of $SiO_2$ is formed above contact layer 205.

Figure 8F:
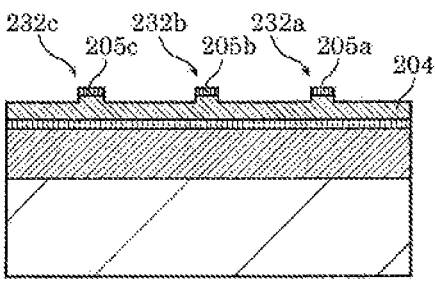
FIG. 8F is a schematic sectional view illustrating a sixth step of the method of producing the semiconductor light emitting device according to Embodiment 2.

Next, as illustrated in FIG. 8F, contact layer 205 and clad layer 204 of a second conductivity type are etched using masks 223 formed into a band shape, and then masks 223 are removed through wet etching to form ridges 232a, 232b, and 232c. Thereby, out of contact layer 205, only contact layers 205a, 205b, and 205c disposed in ridges 232a, 232b, and 232c, respectively, are left to reduce the film thickness of the portions other than the ridges of clad layer 204 of a second conductivity type.

Figure 8G:
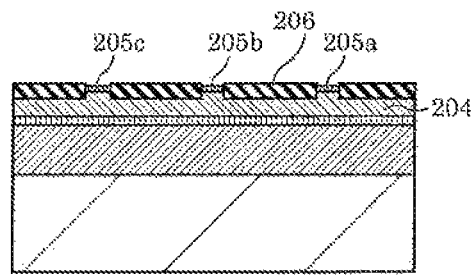
FIG. 8G is a schematic sectional view illustrating a seventh step of the method of producing the semiconductor light emitting device according to Embodiment 2.

Next, insulating layer 206 is formed above clad layer 204 of a second conductivity type and contact layers 205a, 205b, and 205c. Subsequently, as illustrated in FIG. 8G, only insulating layer 206 above layers 205a, 205b, and 205c is removed to expose the top surface of contact layers 205a, 205b, and 205c.

Figure 8H:
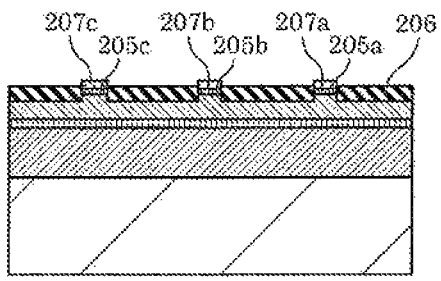
FIG. 8H is a schematic sectional view illustrating an eighth step of the method of producing the semiconductor light emitting device according to Embodiment 2.
Figure 8I:
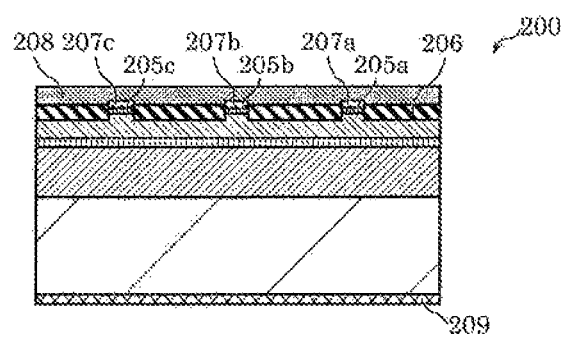
FIG. 8I is a schematic sectional view illustrating a ninth step of the method of producing the semiconductor light emitting device according to Embodiment 2.

Next, as illustrated in FIG. 8H, second conductive-side electrodes 207a, 207b, and 207c are formed above contact layers 205a, 205b, and 205c, respectively. Subsequently, pad electrode 208 is formed to cover second conductive-side electrodes 207a, 207b, and 207c and insulating layer 206. Next, first conductive-side electrode 209 is formed on the bottom surface of substrate 201 (the lower surface in FIG. 8I). Thus, as illustrated in FIG. 8L semiconductor light emitting device 200 can be formed.

Similarly to semiconductor light emitting device 100 according to Embodiment 1, among three light emitting elements 230a, 230b, and 230c in semiconductor light emitting device 200 according to the present embodiment, the off angle of substrate 201 in region 201b including light emitting element 230b located in the central area in the alignment direction is smaller than that in regions 201a and 201c including light emitting elements 230a and 230c located in both end areas in the alignment direction. For this reason, semiconductor light emitting device 200 including a laminate structure laminated above substrate 201 can facilitate the implementation of the configuration where the compositional ratio of In in active layer 203 is smaller in the central area in the alignment direction than in both end areas therein.

[2-3. Modification]

A modification of semiconductor light emitting device 200 according to the present embodiment will now be described. The present modification is the same as semiconductor light emitting device 200 except that that the composition and emission wavelength of the semiconductor layer are different. The present modification will now be described mainly for the differences from semiconductor light emitting device 200.

The semiconductor light emitting device according to the present modification emits green laser light having a wavelength of about 520 nm. To provide such an emission wavelength, the clad layer of a first conductivity type and the clad layer of a second conductivity type according to the present modification are made of an n-type $Al_xGa_{1-x}N$ (where x=0.2) and a p-type $Al_xGa_{1-x}N$ (where x=0.2), respectively. The well layer and the barrier layer in the active layer are made of an undoped $In_xGa_{1-x}N$ (where x≥0.3000) and an undoped GaN. In the present embodiment, the compositional ratio of In in the well layer in the active layer is smaller in the light emitting element located in the central area in the alignment direction than in the light emitting elements located in both end areas. Specifically, the compositional ratio of In in the well layer is 0.3000 (i.e., 30.00%) in the emitter located in the central area in the alignment direction, and is 0.3015 (i.e., 30.15%) in the emitter located in both end areas in the alignment direction. Similarly to semiconductor light emitting device 200, in the semiconductor light emitting device according to the present modification, the compositional ratio of In in the well layer in the active layer continuously increases from the central area toward both end areas in the alignment direction.

Thus, the semiconductor light emitting device according to the present modification having the distribution of the compositional ratio of In in the well layer in the active layer can also enhance the uniformity of the emission wavelength among the light emitting elements as in semiconductor light emitting device 200. In the present modification, a low-cost semiconductor light emitting device having a simplified configuration can be implemented as in Embodiment 1.

Embodiment 3

The projection apparatus according to Embodiment 3 will be described. The projection apparatus (projector) according to the present embodiment includes the semiconductor light emitting devices according to Embodiments 1 and 2 and the modification of Embodiment 2. The projection apparatus according to the present embodiment will now be described with reference to FIG. 9.

Figure 9:
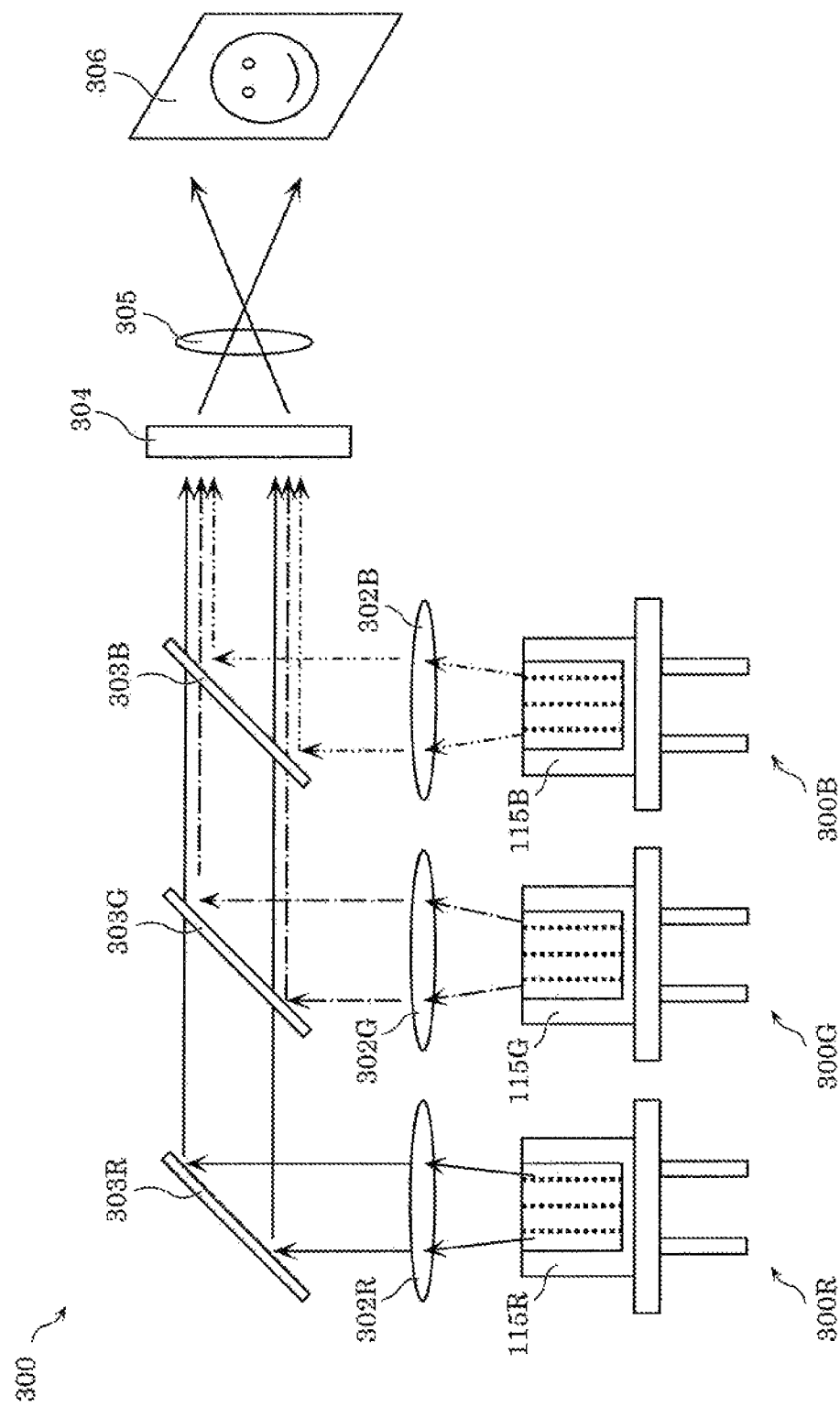
FIG. 9 is a schematic view illustrating the projection apparatus according to Embodiment 3.
Figure 10:
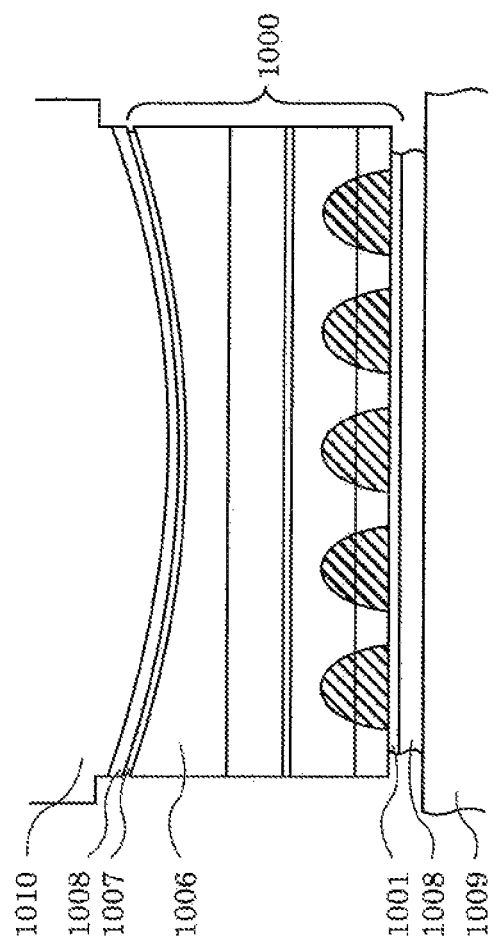
FIG. 10 is a block diagram illustrating a conventional semiconductor array laser device.

FIG. 9 is a schematic view illustrating projection apparatus 300 according to the present embodiment. As illustrated in FIG. 9, projection apparatus 300 is one example of an image display apparatus including a semiconductor light emitting device. Projection apparatus 300 according to the present embodiment includes light sources, for example, semiconductor light emitting module 300R which emits red laser light, semiconductor light emitting module 300G which emits green laser light, and semiconductor light emitting module 300B which emits blue laser light. For example, semiconductor light emitting modules 300R, 300G, and 300B include semiconductor light emitting device 100 according to Embodiment 1, semiconductor light emitting device according to the modification of Embodiment 2, and semiconductor light emitting device 200 according to Embodiment 2, respectively. Semiconductor light emitting modules 300R, 300G, and 300B include packages 115R. 115G, and 115B, respectively, the packages being the same as package 115 illustrated in the mount form of Embodiment 1.

Projection apparatus 300 includes lenses 302R, 302G, and 302B, mirror 303R, dichroic mirror 303G, and dichroic mirror 303B, spatial light modulator 304, and projection lens 305.

Lenses 302R, 302G, and 302B are collimator lenses, for example, and are disposed in front of semiconductor light emitting modules 300R, 300G, and 300B, respectively.

Mirror 303R reflects the red laser light radiated from semiconductor light emitting module 300R. Dichroic mirror 303G reflects the green laser light radiated from semiconductor light emitting module 300G and transmits the red laser light radiated from semiconductor light emitting module 300R. Dichroic mirror 303B reflects the blue laser light radiated from semiconductor light emitting module 300B and transmits the red laser light radiated from semiconductor light emitting module 300R and the green laser light radiated from semiconductor light emitting module 300G.

Using the red laser light from semiconductor light emitting module 300R, the green laser light from semiconductor light emitting module 300G, and the blue laser light from semiconductor light emitting module 300B, spatial light modulator 304 forms red, green, and blue images according to the input image signal input to projection apparatus 300. As spatial light modulator 304, a liquid crystal panel or a digital mirror device (DMD) using a microelectromechanical system (MEMS) can be used.

Projection lens 305 projects the image formed by spatial light modulator 304 onto screen 306.

In projection apparatus 300 having such a configuration, the laser light beams radiated from semiconductor light emitting modules 300R, 300G, and 300B are converted into approximately parallel light beams through lenses 302R, 302G, and 302B, and enter mirror 303R, dichroic mirror 303G, and dichroic mirror 303B, respectively.

Mirror 303R reflects the red laser light radiated from semiconductor light emitting module 300R in the 45° direction. Dichroic mirror 303G transmits the red laser light radiated from semiconductor light emitting module 300R and reflected by mirror 303R, and reflects the green laser light radiated from semiconductor light emitting module 300G in the 45° direction. Dichroic mirror 303B transmits the red laser light radiated from semiconductor light emitting module 300R reflected by mirror 303R and the green laser light radiated from semiconductor light emitting module 300G reflected by dichroic mirror 303G, and reflects the blue laser light radiated from semiconductor light emitting module 300B in the 45° direction.

The red, green, and blue laser light beams reflected by mirror 303R, dichroic mirror 303G, and dichroic mirror 303B enter spatial light modulator 304 in a time division mode (for example, the laser light is sequentially switched from red to green to blue at a switching cycle of 120 Hz). In this case, spatial light modulator 304 displays a red image when the red laser light enters, displays a green image when the green laser light enters, and displays a blue image when the blue laser light enters.

Thus, the red, green, and blue laser light beams undergoing spatial modulation by spatial light modulator 304 are converted into red, green, and blue images, which are projected onto screen 306 through projection lens 305. In this case, although the red, green, and blue images projected onto screen 306 in the time division mode are monochromatic, these images are recognized by the human eyes as an image of a mixed color of these colors, namely, a color image.

Thus, because projection apparatus 300 according to the present embodiment includes the semiconductor light emitting devices according to the embodiments and its modification as semiconductor light emitting modules 300R, 300G, and 300B, it results in high coupling efficiency of the laser light beams emitted from the emitters. For this reason, projection apparatus 300 having high luminance and a high definition can be implemented.

MODIFICATIONS

Although semiconductor laser devices and the projection apparatus according to the present disclosure have been described based on Embodiments 1 to 8 and the modification of Embodiment 2 as above, these embodiments and the modification should not be construed as limitations to the present disclosure.

For example, although each semiconductor light emitting device includes three light emitting elements in the embodiments and the modification above, the number of light emitting elements is not limited to three. Each semiconductor light emitting device may include three or more light emitting elements.

Although the first conductivity type of the semiconductor layer is the n-type and the second conductivity type is the p-type in the embodiments and the modification above, the first conductivity type may be the p-type and the second conductivity type may be the n-type.

Although each active layer has a quantum well structure in the embodiments and the modification above, the active layer can have any other structure than the quantum well structure.

Although each semiconductor light emitting device is a laser element including an optical cavity in the embodiments and the modification above, the semiconductor light emitting device may be a super luminescent diode.

Although current confinement has been implemented with the ridge structure in the semiconductor light emitting devices according to the embodiments and the modification above, current confinement can be implemented with any other method, and an electrode stripe structure or an embedding structure may be used.

The present disclosure also covers embodiments obtained by making a variety of modifications of the embodiments conceived by persons skilled in the art, and embodiments including any combination of the components and functions in the embodiments without departing from the gist of the present disclosure.

INDUSTRIAL APPLICABILITY

The semiconductor light emitting device according to the present disclosure can be used in projection apparatuses as a light source having high uniformity of the emission wavelength.

The invention claimed is:

1. A semiconductor light emitting device, comprising:
a substrate; and
an array including three or more light emitting elements which are aligned above and along a main surface of the substrate and each emit light,
wherein the three or more light emitting elements each include:
a clad layer of a first conductivity type disposed above the substrate, the clad layer of the first conductivity type being a layer that is entirely a semiconductor of the first conductivity type,
an active layer containing In disposed above the clad layer of the first conductivity type, and
a clad layer of a second conductivity type disposed above the active layer, the clad layer of the second conductivity type being a layer that is entirely a semiconductor of the second conductivity type, the second conductivity type being different from the first conductivity type,
among the three or more light emitting elements, a compositional ratio of In in the active layer is smaller in a light emitting element located in a central area in an alignment direction than in light emitting elements located in both end areas in the alignment direction, and
among the three or more light emitting elements, an off angle of the substrate in a region including the light emitting element located in the central area in the alignment direction is smaller than an off angle of the substrate in regions including the light emitting elements located in both end areas in the alignment direction.

2. The semiconductor light emitting device according to claim 1,
wherein the active layer has a quantum well structure including a well layer and a barrier layer, and
among the three or more light emitting elements, a compositional ratio of In in the well layer is smaller in the light emitting element located in the central area in the alignment direction than in the light emitting elements located in both end areas in the alignment direction.

* * * * *